United States Patent
Dusad et al.

(10) Patent No.: US 9,847,760 B1
(45) Date of Patent: Dec. 19, 2017

(54) SWITCHED CAPACITOR GAIN STAGE

(71) Applicant: Texas Instruments Incorporated, Dallas, TX (US)

(72) Inventors: Shagun Dusad, Bengaluru (IN); Rajendrakumar Joish, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/620,171

(22) Filed: Jun. 12, 2017

(30) Foreign Application Priority Data

Jun. 13, 2016 (IN) .............................. 201641020736

(51) Int. Cl.
*H03M 1/12* (2006.01)
*H03F 3/00* (2006.01)
*G11C 27/02* (2006.01)
*H04B 1/40* (2015.01)

(52) U.S. Cl.
CPC ........... *H03F 3/005* (2013.01); *G11C 27/026* (2013.01); *H03M 1/12* (2013.01); *H04B 1/40* (2013.01)

(58) Field of Classification Search
CPC .......... H03F 3/005; H03F 2203/45012; H03M 1/12; H04B 1/40
USPC ... 455/127.2, 136, 138, 232.1, 240.1, 245.1, 455/251.1; 341/126, 155
See application file for complete search history.

(56) References Cited

U.S. PATENT DOCUMENTS

| | | | | |
|---|---|---|---|---|
| 5,574,457 A * | 11/1996 | Garrity | ................... | H03F 3/005 341/155 |
| 6,400,301 B1 * | 6/2002 | Kulhalli | .................. | H03F 3/005 341/155 |
| 6,445,319 B1 * | 9/2002 | Bugeja | ................ | H03M 1/1038 341/138 |
| 6,853,241 B2 * | 2/2005 | Fujimoto | ................ | H03F 3/005 327/124 |
| 7,068,203 B2 * | 6/2006 | Maloberti | ........... | H03F 3/45977 330/9 |
| 7,280,812 B2 * | 10/2007 | Demir | ...................... | H04B 1/30 375/316 |
| 9,231,524 B2 * | 1/2016 | Cowley | ................ | H03D 7/1466 |
| 9,312,831 B2 * | 4/2016 | Nestler | .................. | H03H 15/02 |

* cited by examiner

*Primary Examiner* — Sonny Trinh
(74) *Attorney, Agent, or Firm* — John R. Pessetto; Charles A. Brill; Frank D. Cimino

(57) ABSTRACT

The disclosure provides a circuit. The circuit includes a gain stage block. The gain stage block is coupled to an input voltage through a first switch. A first capacitor is coupled between the first switch and a ground terminal. A second capacitor is coupled between the first switch and a second switch. A third switch is coupled between the second capacitor and a fixed terminal of the gain stage block.

20 Claims, 3 Drawing Sheets

SWITCHED CAPACITOR GAIN STAGE

CROSS REFERENCE TO RELATED APPLICATION(S)

This application claims priority from India provisional patent application No. 201641020736 filed on Jun. 13, 2016 which is hereby incorporated by reference in its entirety.

TECHNICAL FIELD

The present disclosure is generally related to an analog signal chain and more particularly to a switched capacitor gain stage circuit used in the analog signal chain.

BACKGROUND

Recent advancements in analog signal chain require gain stages that are capable of amplifying a wide dynamic range of analog input signals. A switched capacitor gain stage is widely used in analog signal chain. In the switched capacitor gain stage, the analog input signal is sampled in one phase, called the sampling phase, and then gained up in another phase, called the hold phase.

However, there are certain constraints associated with the switched capacitor gain stage. The switched capacitor gain stage is required to settle within the hold phase, and a final settled value is required to be linear. In applications which require multiple switched capacitor gain stages, a noise contribution of each stage is required to be minimal. All these limitations are very difficult to achieve especially in the case of RF ADCs where the frequency of operation is very high.

One conventional approach is to use a closed loop gain stage. The solution can support a large analog input signal swing but it is not a feasible solution when the frequency of operation is very high since it contains many poles inside the loop. Another approach is to use an open loop preamplifier. This solution can support reasonably high frequency of operation but it cannot support a large analog input signal swing and also provides an uncontrolled gain.

SUMMARY

According to an aspect of the disclosure, a circuit is disclosed. The circuit includes a gain stage block. The gain stage block is coupled to an input voltage through a first switch. A first capacitor is coupled between the first switch and a ground terminal. A second capacitor is coupled between the first switch and a second switch. A third switch is coupled between the second capacitor and a fixed terminal of the gain stage block.

BRIEF DESCRIPTION OF THE VIEWS OF DRAWINGS

DETAILED DESCRIPTION OF THE EMBODIMENTS

Figure 1:
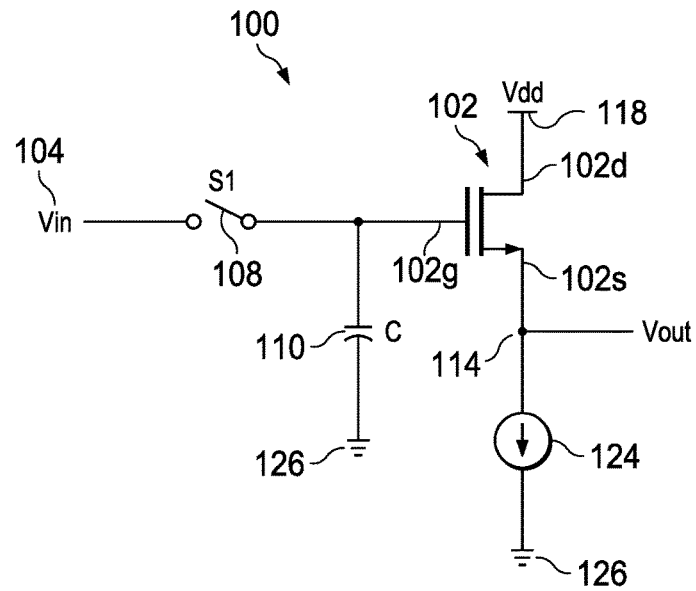
FIG. 1 illustrates a circuit.

FIG. 1 illustrates a circuit 100. The circuit 100 includes a transistor 102. The transistor 102 receives an input voltage Vin 104 through a first switch S1 108. The first switch S1 108 is coupled to a gate terminal 102g of the transistor 102. A capacitor C 110 is coupled to the first switch S1 108 and the gate terminal 102g of the transistor 102. One end of the capacitor C 110 is coupled to a ground terminal 126.

A drain terminal 102d of the transistor 102 is coupled to a source voltage Vdd 118. A source terminal 102s of the transistor 102 is coupled to an output terminal 114 and a current source 124. One end of the current source 124 is coupled to the ground terminal 126.

The operation of the circuit 100 illustrated in FIG. 1 is explained now. The circuit 100 operates in a sample phase and a hold phase. In sample phase, the first switch S1 108 is closed and the capacitor C 110 is charged to the input voltage Vin 104. In the hold phase, the first switch S1 108 is opened, and a voltage at the gate terminal 102g remains equal to the input voltage Vin 104. An output voltage Vout generated at the output terminal 114 is equal to the voltage at the gate terminal 102g of the transistor 102. Hence, the output voltage Vout is equal to the input voltage Vin 104. The output voltage Vout follows the voltage at the gate terminal 102g of the transistor 102. The circuit 100 is a low noise structure that also provides high bandwidth.

Figure 2:
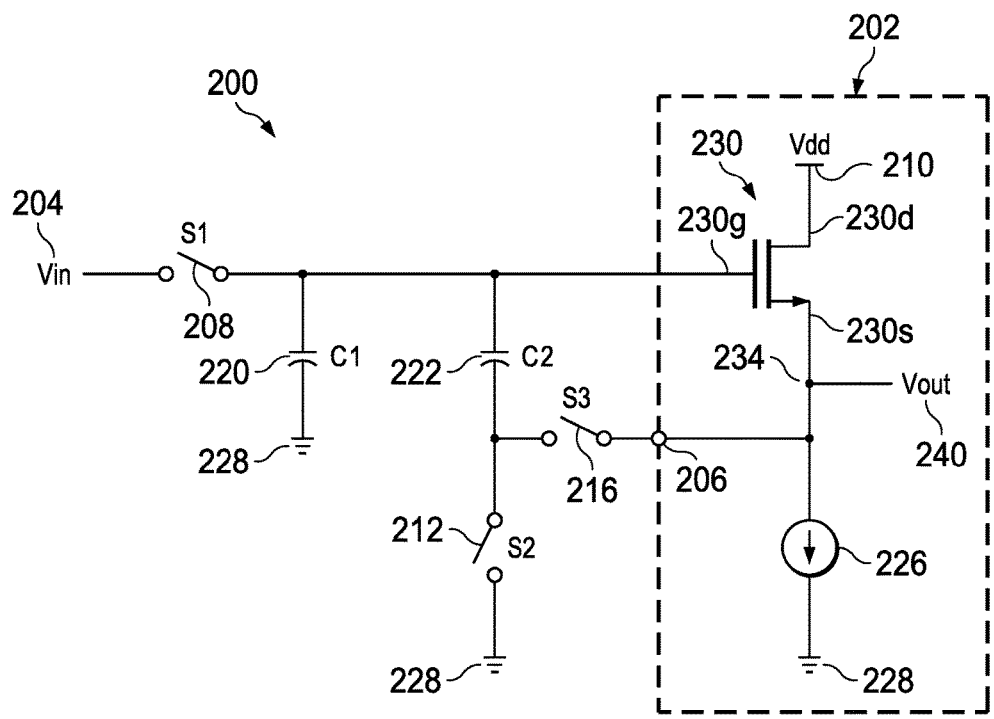
FIG. 2 illustrates a circuit, according to an embodiment.

FIG. 2 illustrates a circuit 200, according to an embodiment. The circuit 200 includes a gain stage block 202. The gain stage block 202 is coupled to an input voltage Vin 204 through a first switch S1 208. A first capacitor C1 220 is coupled between the first switch S1 208 and a ground terminal 228. A second capacitor C2 222 is coupled between the first switch S1 208 and a second switch S2 212. One end of the second switch S2 212 is coupled to the ground terminal 228. The first capacitor C1 220 and the second capacitor C2 222 are coupled to the gain stage block 202.

A third switch S3 216 is coupled between the second capacitor C2 222 and a fixed terminal 206 of the gain stage block 202. The gain stage block 202 includes a transistor 230. A gate terminal 230g of the transistor 230 receives the input voltage Vin 204 through the first switch S1 208. A drain terminal 230d of the transistor 230 is coupled to a source voltage Vdd 210. A source terminal 230s of the transistor 230 is coupled to an output terminal 234 and a current source 226. One end of the current source 226 is coupled to the ground terminal 228.

The fixed terminal 206 of the gain stage block 202 is coupled to at least one of an output terminal and an intermediate terminal of the gain stage block 202. As illustrated in FIG. 2, the fixed terminal 206 is coupled to the output terminal 234 of the gain stage block 202. The circuit 200 may include one or more additional components known to those skilled in the relevant art and are not discussed here for simplicity of the description.

The operation of the circuit 200 illustrated in FIG. 2 is explained now. The circuit 200 operates in a sampling mode and a hold mode. In sampling mode, the first switch S1 208 and the second switch S2 212 are closed. The third switch S3 216 is opened. The first capacitor C1 220 and the second capacitor C2 222 are charged to the input voltage Vin 204.

In the hold mode, the first switch S1 208 and the second switch S2 212 are opened while the third switch S3 216 is closed. The second capacitor C2 222 gets discharged and all of its charge goes to the first capacitor C1 220. Thus, the first capacitor C1 220 is charged to a third voltage (Vt) which is defined as follows:

$$Vt = (C_1 + C_2) * V_{in}/C_1 \quad (1)$$

The above equation 1 assumes that a gain of the gain stage block 202 is unity. In case, the gain of the gain stage block 202 is given as Gnv, the third voltage (Vt) is represented as:

$$Vt = \frac{C1 + C2}{C1 + C2(1 - Gnv)} * Vin \qquad (2)$$

The gain (Gnv) of the gain stage block 202 is measured at the fixed terminal 206. The voltage at the gate terminal 230g of the transistor 230 is equal to the third voltage (Vt). The voltage generated at the fixed terminal 206 of the gain stage block 202 is equal to a product of the third voltage (Vt) and the gain of the gain stage block 202.

$$Vf = Vt * Gnv \qquad (3)$$

where Vf is the voltage generated at the fixed terminal 206 and Gnv is the gain of the gain stage block 202.

Also, the voltage Vf generated at the fixed terminal 206 and the input voltage Vin 204 have a non-inverting relationship. An output voltage Vout 240 is generated at the output terminal 234 of the gain stage block 202. The output voltage Vout 240 follows the voltage generated at the gate terminal 230g of the transistor 230. Thus, the output voltage Vout 240 is equal to the voltage generated at the fixed terminal Vf.

$$Vout = Vf = Vt * Gnv \qquad (4)$$

$$Vout = \frac{C1 + C2}{C1} * Vin * Gnv \qquad (5)$$

When a value of the first capacitor C1 220 is equal to the second capacitor C2 222, the output voltage Vout 240 is twice of the input voltage Vin 204. Thus, the circuit 200 can be used as a gain stage in switched capacitor circuits. The circuit 200 will realize higher gain as compared to a conventional continuous time gain circuits. It is to be noted that the gain stage block 202 is one of the many ways of implementing the gain stage block and variations, and alternative constructions are apparent and well within the spirit and scope of the disclosure.

As compared to conventional approaches, the circuit 200 provides an accurate gain stage which can achieve high bandwidth in a given technology for a switched capacitor circuit. Also, the circuit 200 can support high swing of the input voltage Vin 204, and is usable when frequency of operation is very high. The circuit 200 is a low noise circuit as compared to conventional circuits for a given bandwidth. The circuit 200 can be used as a variable gain amplifier in a signal chain and can also provide unity gain.

The circuit 200 can be used as a frontend gain stage and also as any gain stage in a signal chain for example in the MDAC (multiplying DAC) stage of a pipeline ADC. The circuit 200 absorbs parasitic capacitor at input into the first capacitor C1 220, and hence gives a better noise performance as compared to conventional gain stage circuits.

Figure 3:
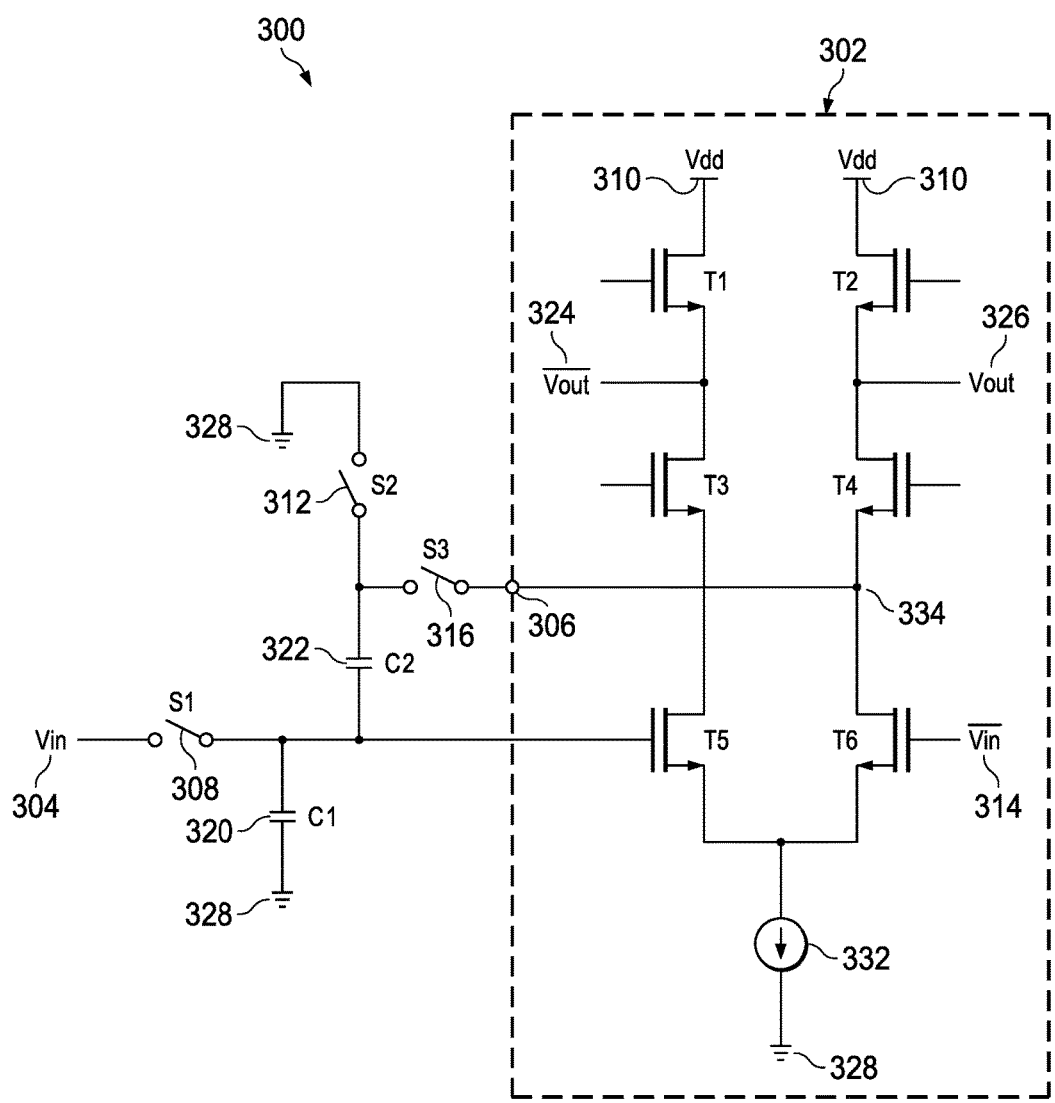
FIG. 3 illustrates a circuit, according to an embodiment.

FIG. 3 illustrates a circuit 300, according to an embodiment. The circuit 300 includes a gain stage block 302. The gain stage block 302 is coupled to an input voltage Vin 304 through a first switch S1 308. A first capacitor C1 320 is coupled between the first switch S1 308 and a ground terminal 328. A second capacitor C2 322 is coupled between the first switch S1 308 and a second switch S2 312. One end of the second switch S2 312 is coupled to the ground terminal 328.

A third switch S3 316 is coupled between the second capacitor C2 322 and a fixed terminal 306 of the gain stage block 302. The gain stage block 302 includes a preamplifier that has six transistors illustrates as T1 to T6. Transistors T1 and T2 are coupled to a source voltage Vdd 310. Transistor T5 and T6 are coupled to a current source 332. One end of the current source 332 is coupled to the ground terminal 328.

Transistor T5 is coupled to the input voltage Vin 304 through the first switch S1 308. Transistor T6 receives an inverted input voltage $\overline{Vin}$ 314. The preamplifier generates an output voltage Vout 326 and an inverted output voltage $\overline{Vout}$ 324. The fixed terminal 306 of the gain stage block 302 is coupled to at least one of an output terminal and an intermediate terminal of the gain stage block 302. As illustrated in FIG. 3, the fixed terminal 306 is coupled to an intermediate terminal 334 of the gain stage block 302. The circuit 300 may include one or more additional components known to those skilled in the relevant art and are not discussed here for simplicity of the description.

The operation of the circuit 300 illustrated in FIG. 3 is explained now. The circuit 300 operates in a sampling mode and a hold mode. In sampling mode, the first switch S1 308 and the second switch S2 312 are closed. The third switch S3 316 is opened. The first capacitor C1 320 and the second capacitor C2 322 are charged to the input voltage Vin 304.

In the hold mode, the first switch S1 308 and the second switch S2 312 are opened while the third switch S3 316 is closed. The second capacitor C2 322 gets discharged and all of its charge goes to the first capacitor C1 320. Thus, the first capacitor C1 320 is charged to a third voltage (Vt) which is defined as follows:

$$Vt = (C_1 + C_2) * V_{in} / C_1 \qquad (6)$$

The above equation 6 assumes that a gain of the gain stage block 302 is unity. In case, the gain of the gain stage block 302 is given as Gnv, the third voltage (Vt) is represented as:

$$Vt = \frac{C1 + C2}{C1 + C2(1 - Gnv)} * Vin \qquad (7)$$

The gain (Gnv) of the gain stage block 302 is measured at the fixed terminal 306. The voltage generated at the fixed terminal 306 of the gain stage block 302 is equal to a product of the third voltage (Vt) and the gain of the gain stage block 302.

$$Vf = Vt * Gnv \qquad (8)$$

where Vf is the voltage generated at the fixed terminal 306 and Gnv is the gain of the gain stage block 302.

Also, the voltage Vf generated at the fixed terminal 306 and the input voltage Vin 304 have a non-inverting relationship. A voltage generated at the intermediate terminal of the gain stage block 302 follows the voltage generated at the fixed terminal 306. Hence, the voltage generated at the intermediate terminal 334 is defined as:

$$Vi = Vf = Vt * Gnv \qquad (9)$$

$$Vi = \frac{C1 + C2}{C1} * Vin * Gnv \qquad (10)$$

When a value of the first capacitor C1 320 is equal to the second capacitor C2 322, the voltage at the intermediate terminal 334 is twice of the input voltage Vin 304. Thus, the circuit 300 can be used as a gain stage in switched capacitor circuits. The circuit 300 will realize higher gain as compared to a conventional continuous time gain circuits. It is to be noted that the gain stage block 302 is one of the many ways of implementing the gain stage block and variations, and alternative constructions are apparent and well within the spirit and scope of the disclosure.

As compared to conventional approaches, the circuit 300 provides an accurate gain stage which can achieve high bandwidth in a given technology for a switched capacitor circuit. The circuit 300 is a low noise circuit as compared to conventional circuits for a given bandwidth. The circuit 300 can be used as a variable gain amplifier in a signal chain and can also provide unity gain.

The circuit 300 can be used as a frontend gain stage and also as any gain stage in a signal chain for example in the MDAC stage of a pipeline ADC. The circuit 300 absorbs parasitic capacitor at input into the first capacitor C1 320, and hence gives a better noise performance as compared to conventional gain stage circuits.

Figure 4:
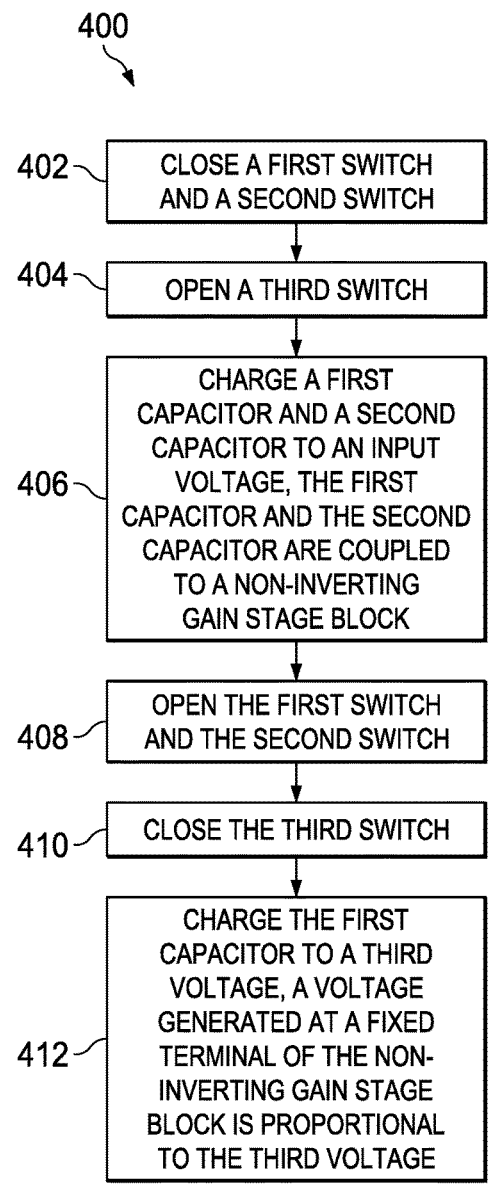
FIG. 4 is a flowchart to illustrate a method of operation of a circuit, according to an embodiment.

FIG. 4 is a flowchart 400 to illustrate a method of operation of a circuit, according to an embodiment. The flowchart 400 is explained in connection with the circuit 200. At step 402, a first switch and a second switch are closed. In circuit 200, for example, the first switch S1 208 and the second switch S2 212 are closed to operate the circuit 200 in sampling mode. A third switch is opened at step 404. In sampling mode, the third switch S3 216 is opened in the circuit 200.

At step 406, a first capacitor and a second capacitor are charged to an input voltage. The first capacitor and the second capacitor are coupled to a gain stage block. In one version, the gain stage block is a non-inverting gain stage block. In circuit 200, the first capacitor C1 220 and the second capacitor C2 222 are charged to the input voltage Vin 204. The circuit 200 includes the gain stage block 202. The gain stage block 202 is coupled to an input voltage Vin 204 through a first switch S1 208.

A first capacitor C1 220 is coupled between the first switch S1 208 and a ground terminal 228. A second capacitor C2 222 is coupled between the first switch S1 208 and a second switch S2 212. The first capacitor C1 220 and the second capacitor C2 222 are coupled to the gain stage block 202. A third switch S3 216 is coupled between the second capacitor C2 222 and a fixed terminal 206 of the gain stage block 202. The fixed terminal 206 of the gain stage block 202 is coupled to at least one of an output terminal and an intermediate terminal of the gain stage block 202.

At step 408, the first switch and the second switch are opened. The third switch is closed at step 410. In circuit 200, in the hold mode, the first switch S1 208 and the second switch S2 212 are opened while the third switch S3 216 is closed. At step 412, the first capacitor is charged to a third voltage. A voltage generated at a fixed terminal of the gain stage block is proportional to the third voltage. In circuit 200, the first capacitor C1 220 is charged to a third voltage (Vt) which is defined in equation 1.

The voltage generated at the fixed terminal 206 of the gain stage block 202 is proportional to the third voltage. In one example, the voltage generated at the fixed terminal 206 of the gain stage block 202 is equal to a product of the third voltage (Vt) and a gain of the gain stage block 202. Also, the voltage generated at the fixed terminal 206 and the input voltage Vin 204 have a non-inverting relationship.

The method illustrated by flowchart 400 can be used to implement a gain stage in switched capacitor circuits. The method will realize higher gain as compared to a conventional continuous time gain circuits. As compared to conventional approaches, the method provides an accurate gain stage which can achieve high bandwidth in a given technology for a switched capacitor circuit.

Also, the method can support high swing of the input voltage and is usable when frequency of operation is very high. The method can be used to implement any gain stage in a signal chain for example in the MDAC stage of a pipeline ADC. Also, it gives a better noise performance as compared to conventional gain stage circuits.

Figure 5:
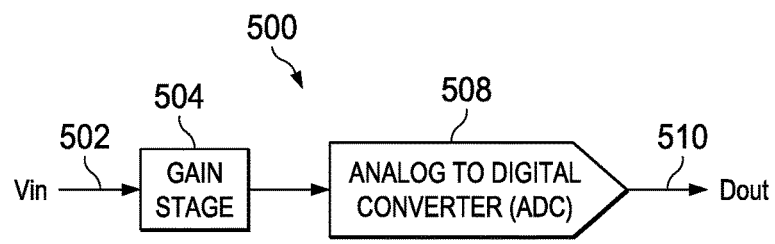
FIG. 5 illustrates a transceiver, according to an embodiment.

FIG. 5 illustrates a transceiver 500, according to an embodiment. The transceiver 500 is incorporated into one or more of devices such as mobile device, laptop, network printer, router, base station, PDA and computer. These devices are connected to a communication network. The communication network may support exchange of data in accordance with the various wireless/wire line communications standards such as, and not limited to, WLAN, WIFI, Bluetooth, dedicated RF channel, GSM, CDMA, OFDM, satellite communication, cable networking, PSTN, DSL etc. These devices transmit and receive signal carrying information by processing the signal in accordance with one or more such standards.

The transceiver 500 may include one or more additional components known to those skilled in the relevant art and are not discussed here for simplicity of the description. The transceiver 500 may be in an environment which includes a processing unit such as a CPU (central processing unit), and a memory module. The processing unit can be, for example, a CISC-type (Complex Instruction Set Computer) CPU, RISC-type CPU (Reduced Instruction Set Computer), or a digital signal processor (DSP).

The memory module (which can be memory such as RAM, flash memory, or disk storage) stores one or more software applications (e.g., embedded applications) that, when executed by the processing unit, performs any suitable function associated with the transceiver 500.

The transceiver 500 includes a gain stage 504 that receives an input voltage Vin 502. An analog to digital converter (ADC) 508 is coupled to the gain stage 504 and generates a digital output signal Dout 510. At least one of the gain stage 504 and the ADC 508 includes a switched capacitor gain stage (SCGS) circuit. The SCGS circuit is similar to one of the circuit 200 and the circuit 300.

The SCGS circuit includes a gain stage block. The gain stage block receives the input voltage Vin 502 voltage through a first switch. A first capacitor is coupled between the first switch and a ground terminal. A second capacitor is coupled between the first switch and a second switch. One end of the second switch is coupled to the ground terminal. The first capacitor and the second capacitor are coupled to the gain stage block.

A third switch is coupled between the second capacitor and a fixed terminal of the gain stage block. The gain stage includes a transistor. A gate terminal of the transistor receives the input voltage Vin 502 through the first switch. A drain terminal of the transistor is coupled to a source voltage.

The fixed terminal of the gain stage block is coupled to at least one of an output terminal and an intermediate terminal of the gain stage block. A voltage generated at the fixed terminal and the input voltage Vin 502 have a non-inverting relationship. The SCGS circuit operates in a sampling mode and a hold mode. In sampling mode, the first switch and the second switch are closed. The third switch is opened. The first capacitor and the second capacitor are charged to the input voltage.

In the hold mode, the first switch and the second switch are opened while the third switch is closed. The second capacitor gets discharged and all of its charge goes to the first capacitor when a gain of the gain stage block is unity. Thus, the first capacitor is charged to a third voltage. The SCGS circuit will realize higher gain as compared to a conventional continuous time gain circuits.

As compared to conventional approaches, the SCGS circuit provides an accurate gain stage which can achieve high bandwidth in a given technology. Also, the SCGS circuit can support high swing of the input voltage Vin 502, and is usable when frequency of operation is very high. The SCGS circuit is a low noise circuit as compared to conventional circuits for a given bandwidth. The SCGS circuit can be used as a variable gain amplifier in a signal chain and can also provide unity gain.

The SCGS circuit can be used as a frontend gain stage and also as any gain stage in a signal chain for example in the MDAC stage of a pipeline ADC. The SCGS circuit absorbs parasitic capacitor at input into the first capacitor, and hence gives a better noise performance as compared to conventional gain stage circuits.

Modifications are possible in the described embodiments, and other embodiments are possible, within the scope of the claims.

What is claimed is:

1. A circuit comprising:
   a gain stage block coupled to an input voltage through a first switch;
   a first capacitor coupled between the first switch and a ground terminal;
   a second capacitor coupled between the first switch and a second switch; and
   a third switch coupled between the second capacitor and a fixed terminal of the gain stage block.

2. The circuit of claim 1, wherein the fixed terminal is coupled to at least one of an output terminal and an intermediate terminal of the gain stage block, and a voltage generated at the fixed terminal and the input voltage have a non-inverting relationship.

3. The circuit of claim 1, wherein one end of the second switch is coupled to the ground terminal.

4. The circuit of claim 1, wherein the gain stage block includes a transistor whose gate terminal receives the input voltage through the first switch.

5. The circuit of claim 4, wherein the fixed terminal of the gain stage block is coupled to a source terminal of the transistor and the third switch.

6. The circuit of claim 4, wherein a drain terminal of the transistor is coupled to a source voltage.

7. The circuit of claim 1, wherein in a sampling mode:
   the first switch and the second switch are closed;
   the third switch is opened; and
   the first capacitor and the second capacitor are charged to the input voltage.

8. The circuit of claim 1, wherein in a hold mode:
   the first switch and the second switch are opened;
   the third switch is closed; and
   the first capacitor is charged to a third voltage.

9. The circuit of claim 8, wherein the voltage generated at the fixed terminal is equal to a product of the third voltage and a gain of the gain stage block.

10. A method comprising:
    closing a first switch and a second switch;
    opening a third switch;
    charging a first capacitor and a second capacitor to an input voltage, the first capacitor and the second capacitor are coupled to a gain stage block;
    opening the first switch and the second switch;
    closing the third switch; and
    charging the first capacitor to a third voltage, wherein a voltage generated at a fixed terminal of the gain stage block is proportional to the third voltage.

11. The method of claim 10 further comprising:
    providing the input voltage to the gain stage block through the first switch; and
    providing a source voltage to the gain stage block.

12. The method of claim 10, wherein the fixed terminal is coupled to at least one of an output terminal and an intermediate terminal of the gain stage block, and the voltage generated at the fixed terminal and the input voltage have a non-inverting relationship.

13. The method of claim 10 further comprising:
    coupling the first capacitor between the first switch and a ground terminal;
    coupling the second capacitor between the first switch and the second switch; and
    coupling the third switch between the second capacitor and the fixed terminal of the gain stage block.

14. The method of claim 10, wherein the second switch is coupled between the second capacitor and the ground terminal.

15. A transceiver comprising:
    a gain stage configured to receive an input voltage; and
    an analog to digital converter (ADC) coupled to the gain stage, and configured to generate a digital output signal, wherein at least one of the gain stage and the ADC comprises a switched capacitor gain stage circuit, the switched capacitor gain stage circuit comprising:
      a gain stage block coupled to the input voltage through a first switch;
      a first capacitor coupled between the first switch and a ground terminal;
      a second capacitor coupled between the first switch and a second switch; and
      a third switch coupled between the second capacitor and a fixed terminal of the gain stage block.

16. The transceiver of claim 15, wherein the fixed terminal is coupled to at least one of an output terminal and an intermediate terminal of the gain stage block, and a voltage generated at the fixed terminal and the input voltage have a non-inverting relationship.

17. The transceiver of claim 15, wherein the gain stage block is a transistor whose gate terminal receives the input voltage through the first switch and whose drain terminal is coupled to a source voltage.

18. The transceiver of claim 17, wherein the fixed terminal of the gain stage block is coupled to a source terminal of the transistor and the third switch.

19. The transceiver of claim 15, wherein in a sampling mode:
    the first switch and the second switch are closed;
    the third switch is opened; and
    the first capacitor and the second capacitor are charged to the input voltage.

20. The transceiver of claim 15, wherein in a hold mode:
    the first switch and the second switch are opened;
    the third switch is closed; and
    the first capacitor is charged to a third voltage.

* * * * *